US009722566B1

(12) United States Patent
Williams et al.

(10) Patent No.: US 9,722,566 B1
(45) Date of Patent: Aug. 1, 2017

(54) SYSTEMS AND METHODS FOR TUNING RESONATORS

(71) Applicants: John D. Williams, Decatur, AL (US); Robert Lindquist, Madison, AL (US)

(72) Inventors: John D. Williams, Decatur, AL (US); Robert Lindquist, Madison, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 145 days.

(21) Appl. No.: 14/528,644

(22) Filed: Oct. 30, 2014

Related U.S. Application Data

(60) Provisional application No. 61/898,276, filed on Oct. 31, 2013.

(51) Int. Cl.
*H03H 7/01* (2006.01)
*H03J 5/18* (2006.01)
*H03H 3/00* (2006.01)

(52) U.S. Cl.
CPC ............ *H03H 7/0153* (2013.01); *H03H 3/00* (2013.01); *H03H 7/0115* (2013.01); *H03J 5/18* (2013.01); *H03H 2210/015* (2013.01); *H03J 2200/06* (2013.01)

(58) Field of Classification Search
CPC ......... H03H 7/0115; H03H 2001/0085; H03H 7/0153; H03H 3/00; H03H 2210/015; H03J 5/18
USPC ....... 333/167, 168, 175, 185, 204, 205, 219, 333/235, 174
See application file for complete search history.

(56) References Cited

U.S. PATENT DOCUMENTS

| 5,084,801 | A | * | 1/1992 | El-Hamamsy | ........... | H01G 7/06 |
| | | | | | | 315/248 |
| 5,422,610 | A | * | 6/1995 | Heine | ..................... | H01P 1/205 |
| | | | | | | 333/134 |
| 5,627,502 | A | * | 5/1997 | Ervasti | ..................... | H03H 7/01 |
| | | | | | | 333/134 |

(Continued)

OTHER PUBLICATIONS

JP2005-347781 (English Translation); Oshimura Masahiko; Dec. 2005.*

(Continued)

*Primary Examiner* — Stephen E Jones
*Assistant Examiner* — Rakesh Patel
(74) *Attorney, Agent, or Firm* — Maynard Cooper & Gale, P.C.; Jon E. Holland

(57) ABSTRACT

A high-Q factor resonator includes a solenoid having an embedded capacitor assembled in a machinable high-frequency dielectric printed circuit board ("PCB"), or other substrate. The solenoid comprises a plurality of surface conductors positioned on upper and lower surfaces of the PCB. The solenoid further comprises a plurality of conductive vias extending through the PCB between the surface conductors, and at least two aligned vias are separated by a capacitive gap. A liquid crystal dielectric is embedded within the capacitive gap in order to control the capacitance. Accordingly, a tunable capacitive filter is achieved by changing the dielectric permittivity of the liquid crystal. In one example, a nematic liquid crystal is sealed in the capacitive gap and has its permittivity changed with a low frequency bias to tune the capacitor.

22 Claims, 9 Drawing Sheets

(56) References Cited

U.S. PATENT DOCUMENTS

| | | |
|---|---|---|
| 6,806,779 B1 | 10/2004 | Kim et al. |
| 7,342,470 B2 | 3/2008 | Bassali |
| 2009/0086451 A1 | 4/2009 | Kim et al. |
| 2010/0252315 A1 | 10/2010 | Liao et al. |
| 2011/0134375 A1* | 6/2011 | Takigawa .......... G02F 1/133634 349/96 |

OTHER PUBLICATIONS

Ziolkowski, et al., "A High-Q Reconfigurable Planar EBG Cavity Resonator," IEEE Microwave and Wireless Component Letters, vol. 11, No. 6, Jun. 2001.
Williams. et al., U.S. Appl. No. 13/283,138, entitled, "High Quality-Factor Resonator," filed Oct. 27, 2011.

\* cited by examiner

SYSTEMS AND METHODS FOR TUNING RESONATORS

CROSS REFERENCE TO RELATED APPLICATION

This application claims priority to U.S. Provisional Patent Application No. 61/898,276, entitled "Systems and Methods for Tuning Resonators" and filed on Oct. 31, 2013, which is incorporated herein by reference.

BACKGROUND

Radio frequency micro-structured resonators may be used to optimize the transmission and filtering features for telecommunication applications or fields of use such as, for example, radars, satellite communications, wireless networks, such as WiFi, WiMax, and mobile communications. The most commonly used parameter to design and fabricate these resonators is a quality factor ("Q-factor"), which indicates performance of the resonator. It is generally desirable to produce resonators having a high Q-factor, and various design techniques have been employed to increase the Q-factor of current resonators.

Examples of design techniques for increasing Q-factor in resonators typically include on-chip resonator designs that employ coils such as, for example, spiral coils, microsolenoids, and cavity resonators. However, parasitic capacitance between the coil and the substrate of the coil has an adverse impact on the performance of the resonator, resulting in lower Q-factors. Current techniques for overcoming such parasitic capacitance in the resonator often require complex fabrication using expensive and unreliable materials. Accordingly, a reliable, relatively inexpensive and easily fabricated resonator with a high Q-factor is desired.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Embodiments of the present disclosure generally pertain to high Q-factor resonators and methods of fabricating the same by embedding liquid crystals into the resonator structure. A high Q-factor resonator in accordance with one embodiment of the present disclosure comprises a solenoid having an embedded capacitor assembled in a machinable high-frequency dielectric printed circuit board ("PCB") or other substrate. The solenoid comprises a plurality of surface conductors positioned on upper and lower surfaces of the PCB. The solenoid further comprises a plurality of conductive vias extending through the PCB. At least two aligned vias are separated by a capacitive gap. In one embodiment, liquid crystal is embedded within the capacitive gap in order to control the capacitance. In this regard, one type of resonator is achieved, i.e., a tunable capacitive filter, by changing the dielectric permittivity of liquid crystal placed within the capacitor. In one example, a nematic liquid crystal is sealed in the capacitive gap and has its permittivity changed with a low frequency bias to tune capacitance and, hence, cut-off frequency.

Figure 1:
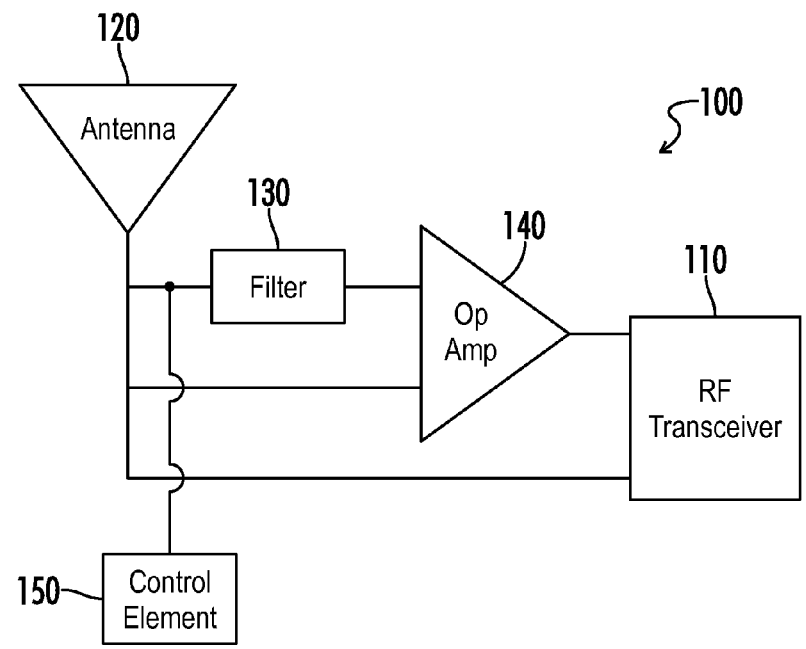
FIG. 1 is a block diagram depicting an illustrative system employing a tunable resonator according to one embodiment of the present disclosure.

FIG. 1 depicts an example embodiment of a system 100 having a radio frequency (RF) transceiver 110 coupled to an antenna 120. In this example, a resonator in the form of a specific filter is described, yet other types of resonators are contemplated for use in one or embodiments herein. In general, resonators are devices that exhibit resonance during operation. The RF transceiver 110 may be configured to accept bandwidth input within the tens of megahertz (MHz), while transmitting a bandwidth digital output in the tens of megahertz; though other frequency ranges are also possible. The signal from a front-end tunable analog notch filter 130 is combined with the input of an RF antenna 120 matched to a specific frequency band using a high frequency operational amplifier 140 to produce a pole resonator at a desired frequency with a specific bandwidth. Thus, the tunable analog notch filter 130 operates at a high resonant frequency within the range of tens of gigahertz (GHz); though other frequency ranges are also possible. The signal from the tunable filter 130 is further amplified by operational amplifier (op amp) 140 as one input source. Op amp 140 is coupled to the output of the tunable filter 130 and the antenna 120; op amp 140 also operates within tens of GHz; though other frequency ranges are also possible.

In one embodiment, for example, the tunable filter 130 operates at 12 GHz, while filtering signals from the antenna 120 operating in the $K_u$ frequency band spectrum (11.2-14 GHz). The op amp 140, coupled to the tunable filter 130, operates at 20 GHz. The output from op amp 140 provides an input to the RF transceiver 110. The architecture shown by way of example in FIG. 1 attenuates bandwidth and improves the Q-factor for the antenna input. In another embodiment, the tunable filter 130 may be driven to operate at hundreds of hertz (Hz) to thousands of hertz under a low frequency bias. A low frequency bias from control element 150 (in the tens of hertz to the thousands of hertz) is applied to alternating current (AC) leads. The permittivity of the LC capacitor in the tunable filter 130 is biased by the voltage of a low frequency signal from control element 150 in order to control the capacitance of the capacitor and, hence, the passband of the tunable filter 130. Control element 150 may be dynamically variable.

Other embodiments may employ other types of antennas operating in different frequency spectrums, such as S, C, and X frequency band spectrums. Each spectrum may have corresponding devices that receive and transmit signals. For example, mobile communication devices such as smartphones may operate in the cellular spectrum, i.e., the S-frequency band. Additionally, more than one antenna and tunable filter may be employed within a system, as is shown hereafter in FIG. 2.

Figure 2:
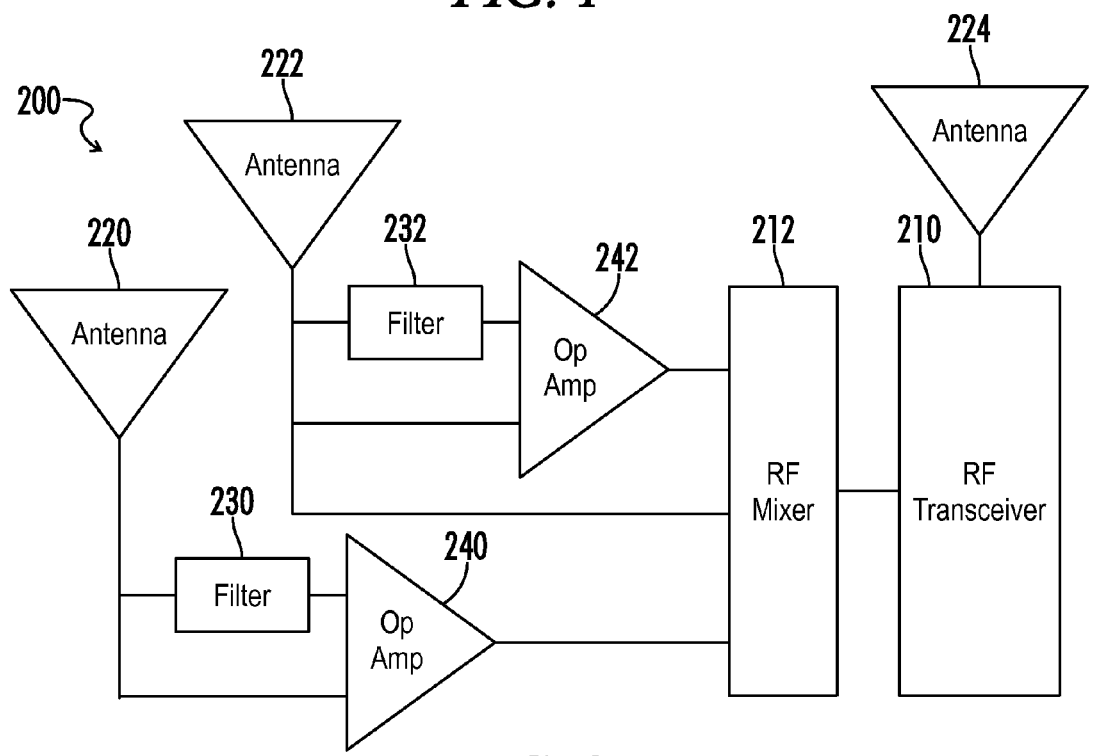
FIG. 2 is a block diagram depicting an illustrative system employing multiple tunable resonators according to another embodiment of the present disclosure.

A multi-antenna architecture 200 is shown in FIG. 2. In addition, multiple high-Q tunable filters reside between the antennas and the RF transceiver 210. Specifically, RF transceiver 210 is shown coupled directly to antenna 224, while antennas 220 and 222 are each coupled to liquid crystal (LC) tunable filters 230 and 232, respectively. High frequency op amp 240 is directly coupled to the output of LC tunable filter 230 and antenna 220 to produce an output signal for input to RF mixer 212. Likewise, a second high frequency op amp 242 receives an input signal from LC tunable filter 232 and a second input signal from antenna 222 to produce an output signal for input to RF mixer 212. RF mixer 212 receives the signals from op amp 240 and op amp 242, and combines them for input to RF transceiver 210. Multi-antenna architectures having narrow band frequencies may be advantageously tuned to significantly improve signal fidelity carrier density for 12 GHz electronic devices, for example. Accordingly, RF mixer 212 may produce several independent channels.

In one embodiment, for the architecture in FIG. 2, each antenna (220, 222, and 224) is a $K_u$ band antenna. Each LC tunable filter (230 and 232) is a 12 GHz tunable analog notch filter providing input to 20 GHz op amps (240 and 242). Thus, for a multiple-input, multiple-output (MIMO) configuration, increased fidelity of each channel improves diversity gain and also signal-to-noise ratio versus bit error rate for the $K_u$ band receivers. Moreover, the disclosed methodolgy enables the division of a given frequency band into several small channels, while utilizing very narrow bands to remove inter-symbol interference (ISI), otherwise known by those skilled in the art as orthogonal frequency division multiplexing (OFDM). Using OFDM causes the reduction of unused bandwidth required between channels. This reduction of unused bandwidth enables designers the opportunity to improve signal quality, provide faster download rates, and increase the number of available channels that may be simultaneously received. The channels may also be increased when multiple tunable filters are employed. The multiple tunable filters, for example, LC tunable filter 230 and LC tunable filter 232 (FIG. 2) provide narrow bands and lower bit error rate because of their higher amplitude.

Figure 3:
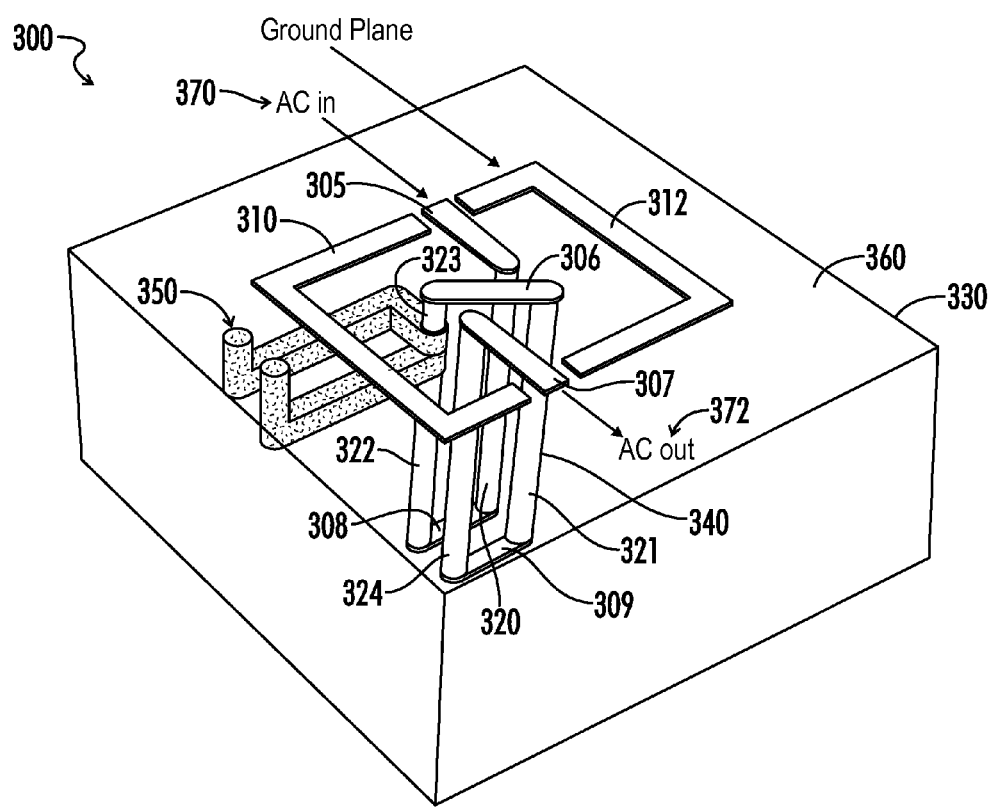
FIG. 3 is a perspective view of an example resonator having embedded liquid crystals.

Referring to FIG. 3, an example tunable resonator 300 is shown. Tunable resonator 300 may include a plurality of conductors 305-309 patterned across several vias 321-324 within a dielectric substrate 330, such as a printed circuit board (PCB) 330, or other type of substrate and formed between conductive elements 310 and 312 that form a ground plane. Conductors 305-307 are formed on a top surface of the substrate 330, and the conductors 308 and 309 are formed on a bottom surface of the substrate 330. Further, the vias 320-324 form an inductor coil 340. The number of inductive turns, PCB thickness, and placement of the capacitor determine the frequency and quality factor (Q-factor) of the resonator.

In the example shown by FIG. 3, the resonator 300 has five vias 320-324 forming two turns, but any number of vias and turns are possible in other embodiments. Further, the conductor 308 conductively couples via 324 to via 322, the conductor 306 conductively coupled via 323 to via 321, and the conductor 309 conductively coupled via 321 to via 320. The conductors 305 and 307 are conductively coupled to the vias 324 and 320, respectively. The conductors 305 and 307 form leads that can be conductively coupled to devices external to the resonator 330, such as the op amp 140 (FIG. 1). As an example, when the resonator 300 of FIG. 3 is implemented as the filter 130 shown by FIG. 1, the conductors 305 may be coupled to the antenna 120 and op amp 140, respectively, and in such example the conductors 305-309 and vias 320-323 carry the high frequency signal received from the antenna 120 and the low frequency bias signal received from the control element 150.

A liquid crystal dielectric (LC) 350 is shown as filling the capacitive gap to form an embedded LC capacitor within the inductor coil 340. Specifically, the vias 322 and 323 are aligned, and at least a portion of the LC 350 is disposed between such vias 322 and 323. The LC 350 may be positioned or held within a channel pattern that is cut-out of the PCB substrate 360. The channel pattern may section or partition the inductive coil into multiple segments. The channel pattern may be considered as a "tube" that includes an inlet and an outlet located on the top surface of the PCB board 330. The tube, in one embodiment, is filled with a nematic liquid crystal and sealed to prevent leakage of the nematic liquid crystal. Accordingly, the LC capacitor is formed within the gap in inductor coil 340 and capacitance is affected by the liquid crystal dielectric material within the gap.

In embodiments that employ the nematic LCs, relative electric permittivity can be varied for the LC capacitor. Accordingly, changes in resonant frequency of the tunable resonator 300 are possible by modification of the capacitance. In one embodiment, a low frequency bias (in the tens of hertz to the thousands of hertz) is applied to alternating current (AC) leads. The permittivity of the LC capacitor is biased by the voltage of a low frequency signal in order to control the capacitance of the capacitor and, hence, the passband of the tunable resonator 300. Referring again to FIG. 2, the GHz frequency signal from the antennas 220 and 222 remains unaffected by the low frequency bias across AC In lead 370 and AC Out lead 372 in FIG. 3.

Figure 4:
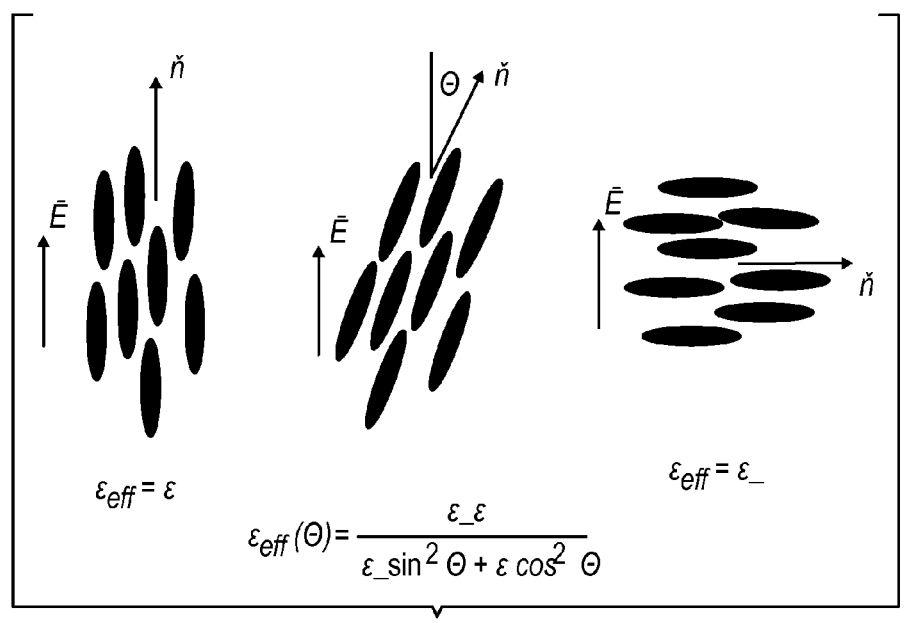
FIG. 4 is an illustration for showing liquid crystal movement.

FIG. 4 depicts liquid crystals (LC) as molecules that are shaped as rigid rods, which collectively align in an average direction, referred to as the director axis, n. In general, LC represent a state of matter between a solid and a liquid in which a material can flow like a liquid, but can also have anisotropic properties of a crystal. The phases of the LC depend on the degree of ordering. In one or more embodiments of this disclosure, nematic LCs are contemplated. A nematic is a thermotropic liquid crystalline phase in which the molecules exhibit rotational ordering, but no translational ordering, as shown in FIG. 4.

The rotational ordering and the shape of the molecules provide the anisotropic properties of a uniaxial crystal. The lack of translational ordering implies the molecules are free to flow like a liquid. The effective dielectric permittivity of a nematic liquid crystal depends on the orientation of the electric field to the director axis. In one embodiment, the PCB substrate 360 (as shown in FIG. 3) is composed of Duroid® and the dielectric permittivity within the capacitive component can be altered or tuned.

As illustrated in FIG. 4, the relative permittivity can vary from ∈(perpendicular) to ∈(parallel). Large anisotropy and low loss found in nematic LC provides a means to manage the electromagnetic radiation across a large spectrum. The flow properties allow for tuning the effective permittivity by modest electric and/or magnetic field-induced molecular reorientation. Depending on the frequency of the electromagnetic radiation, the dielectric anisotropy:

$$\Delta\in=\in(perpendicular)-\in(parallel), \text{ can vary significantly.}$$

Figure 5:
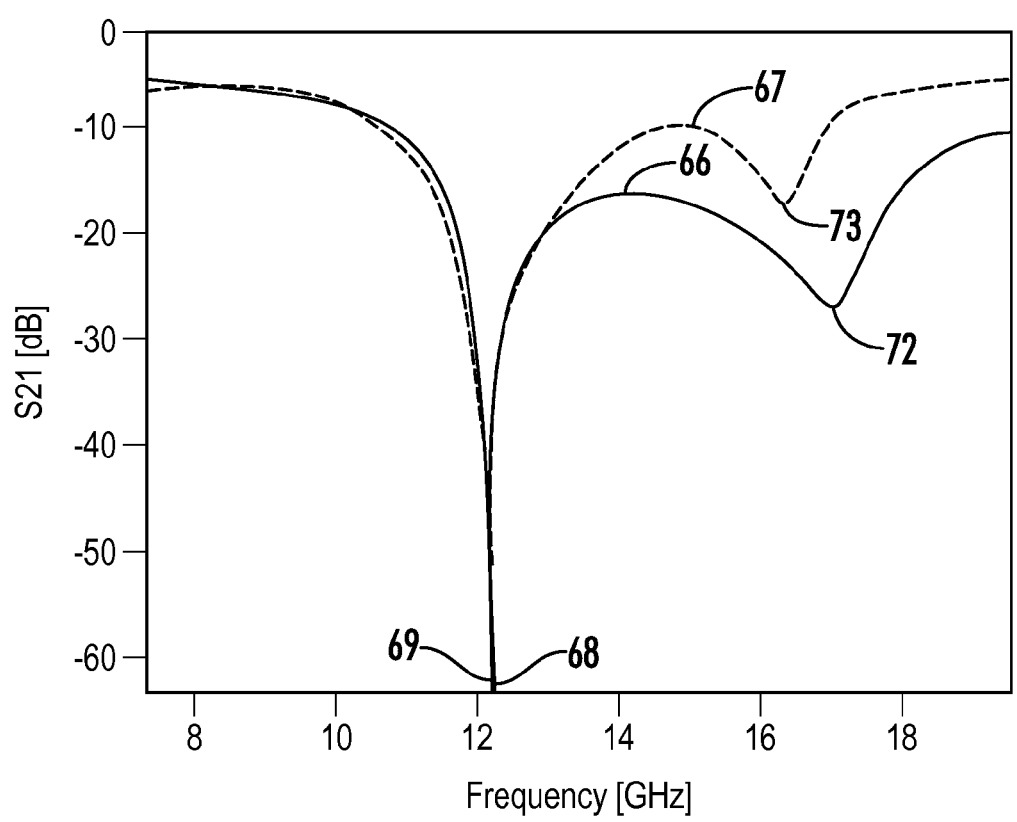
FIG. 5 is a graph depicting simulated and actual measurement results of a resonator, according to at least one embodiment of the present disclosure.

FIG. 5 depicts simulated and actual measured results for one illustrative embodiment of a tunable resonator 300. The simulated results 66 are represented by a solid line, while the measured results 67 are represented by a dashed line. An actual circuit was used to obtain the simulated results 66, and the measured results 67 were obtained by setting the capacitive gap (for the embedding of the liquid crystal dielectric) of the resonator 300 (FIG. 3) at 0.375 millimeters (mm) below the top surface conductor 23, as will be discussed in more detail hereafter. As illustrated in FIG. 5, the first pole 68 of the simulated results 66 occurred at approximately 12.27 Gigahertz (GHz), while the first pole 69 of the measured results 67 occurred at approximately 12.25 GHz. Thus the first poles 68 and 69 of the simulated 66 and measured results 67, respectively, are about the same.

The second pole 72 of the simulated results 66, however, occurred at approximately 16.89 GHz, while the second pole 73 of the measured results 67 occurred at approximately 16.15 GHz. Thus, the second pole 73 of the measured results 67 occurred approximately 740 MHz before the second pole 72 of the simulated results 66. Despite the difference in the second poles 72 and 73, the measured results 67 show that the poles 69 and 73 are relatively far apart. As the distance between the poles 69 and 73 increases, the Q-factor of the resonator 10 increases, with a maximum Q-factor occurring when the distance between the poles 69 and 73 is approximately 5 GHz. The distance between the poles 69 and 73, as shown by FIG. 5, is approximately 3.9 GHz. Accordingly, measured results 67 produced a Q-factor of about 306, which is relatively high. The simulated results 66 produced a Q-factor of about 480 or higher, which shows that even higher measured results 67 are likely possible for the tunable resonator 300. Changing the dimension of the lines, capacitive distances, or capacitive areas in the capacitor embedded tunable resonator 300 alters the configuration such that larger or shorter distances between poles may be realized. Such changes modify the capacitor embedded tunable resonator 300 to provide a similar notch filter result over a range of desired quality factors and resonant frequencies between about 0.5 and 15 GHz.

Figure 6:
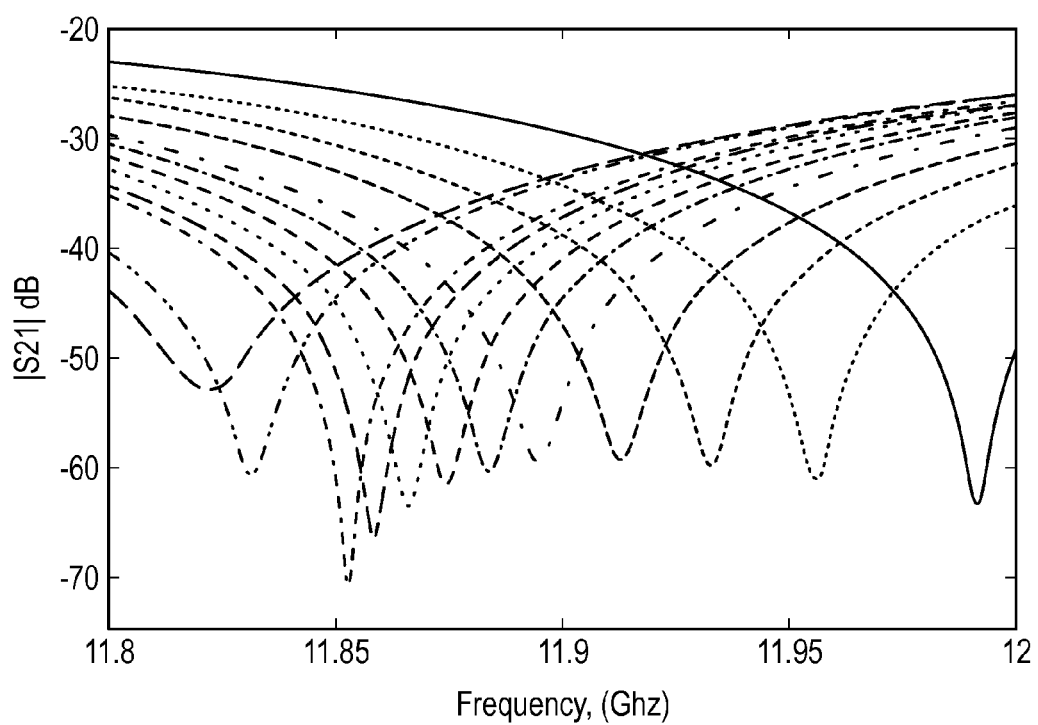
FIG. 6 is another graph depicting example resonant frequency changes resulting from varied permittivity values of a tunable resonator, according to at least one embodiment of the present disclosure.

FIG. 6 depicts the results of a simulation that illustrates the frequency tuning of one example LC tunable resonator operating at different dielectric permittivity conditions. Accordingly, changes occur in resonant frequency of an LC tunable resonator as the relative permittivity of the liquid crystal within the capacitor is varied. For one embodiment, nematic LC materials change insubstantially in dielectric constants at GHz frequencies and as such their high frequency response can be almost completely decoupled from their low frequency polarization. Furthermore, coupling LC materials in the manner disclosed provides a very high resolution measurement tool for evaluating nematic LCs from a frequency range of hundreds of hertz to GHz.

Figure 7:
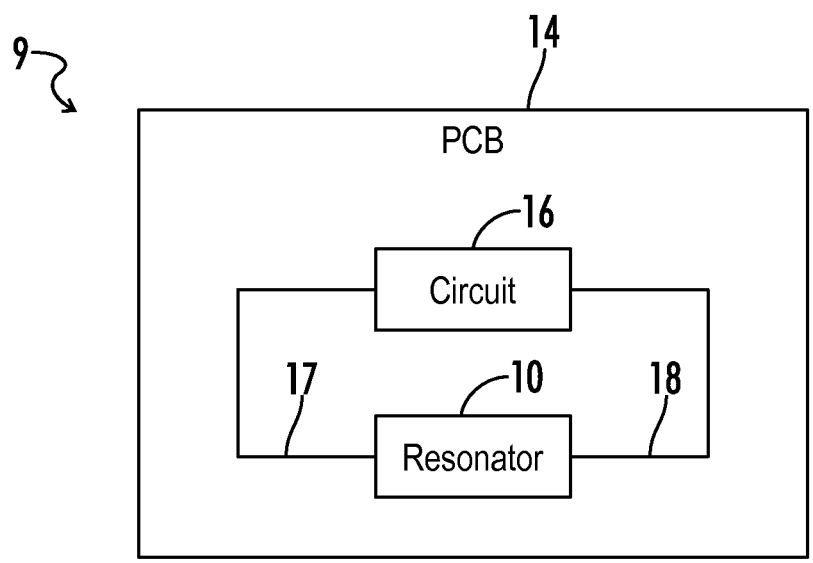
FIG. 7 is a block diagram depicting an example system employing a resonator implemented in a printed circuit board.

As described herein, a novel resonator may be implemented as a notch filter comprising conductive elements patterned across vias (forming an inductive coil) within a printed circuit board (PCB). The inductors are separated by a capacitor that is selectively placed within the PCB. While factors such as the number of inductive turns, PCB thickness, and placement of the capacitor may determine the frequency and Q-factor of the resonator, the placement of a nematic liquid crystal within the capacitor of the previously described resonator will enable the resonator to function as a tunable capacitive filter subject to varying the dielectric permittivity of the nematic liquid crystal. In this regard, FIG. 7 illustrates a resonator 10 implemented in a PCB 14, which forms a dielectric substrate having a low relative permittivity. In one embodiment, the PCB 14 is composed of Duroid®, although other types of materials may be used for the PCB 14 in other embodiments. Further, other types of materials and substrates may be used in other embodiments. As an example, the substrate in which the resonator 10 is embedded may be composed of a ceramic, glass, or plastic with dielectric constants near the desired resonant frequency of the system 9.

Formed on the PCB 14 is a circuit 16 which is configured to perform one or more functions, as may be desired, depending on the intended application. In one embodiment, the circuit 16 transmits, receives, and processes data signals for use in microwave applications, although other types of circuits are possible in other embodiments. The configuration and operation of the circuit 16 are not important for aspects of this disclosure, and the circuit 16 will not be described in detail herein.

The resonator 10 comprises a solenoid (not shown in FIG. 7), but discussed in more detail hereafter, embedded in the PCB 14. The resonator 10 is coupled to the circuit 16 via a plurality of conductive connections 17 and 18 (e.g., copper traces). The resonator 10 is configured to receive data signals from the circuit 16 via the connections 17 and 18 and to increase the resonance frequency and the Q-factor of the data signals received from the circuit 16. Note that the resonator 10 is relatively inexpensive to manufacture and easy to fabricate, as will be described in more detail hereafter. As will be described in more detail hereafter, embedded within the solenoid is a capacitor (not shown in FIG. 7), and the configuration of the capacitor within the solenoid controls various resonator characteristics, such as resonant frequency and Q-factor.

Figure 8:
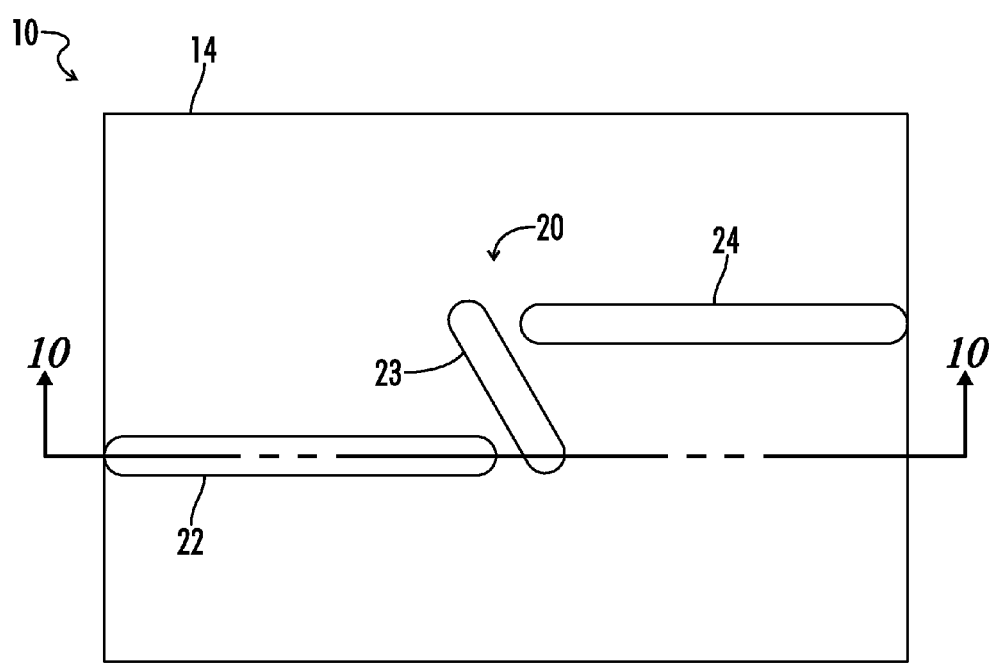
FIG. 8 is a block diagram depicting a top view of one embodiment of a resonator.

FIG. 8 depicts a top view of an exemplary embodiment of a resonator 10. As shown by FIG. 8, the resonator 10 comprises a solenoid 20 embedded in the PCB 14. The solenoid 20 comprises a plurality of conductors 22, 23, 24, referred to hereafter for clarity as "top surface conductors," positioned on a top surface of the PCB 14. Note that, in other embodiments, it is unnecessary for the conductors 22, 23, 24 to be positioned on a top surface of the PCB 14 or other substrate. The top surface conductors 22 and 24 are coupled to the connections 17 and 18 (FIG. 7), respectively. The solenoid 20 comprises conductive material, such as, for example, copper or gold, although other conductive materials may be used in other embodiments, and the solenoid 20 forms at least one turn. The solenoid 20 further comprises a plurality of vias (not shown in FIG. 8) and a plurality of conductors (not shown in FIG. 8) positioned on a bottom surface of the PCB 14, discussed in more detail hereafter. As described earlier, embedded within the solenoid 20 is a capacitor (not shown in FIG. 8), which is formed by a dielectric substance, such as nematic liquid crystals, for example, positioned within a turn of the solenoid 20. Specifically, the dielectric substance is positioned between and separates vias that form a part of the solenoid and shall be referred to as a "capacitive gap." Such a solenoid shall be referred to herein as a "capacitor embedded solenoid."

Figure 9:
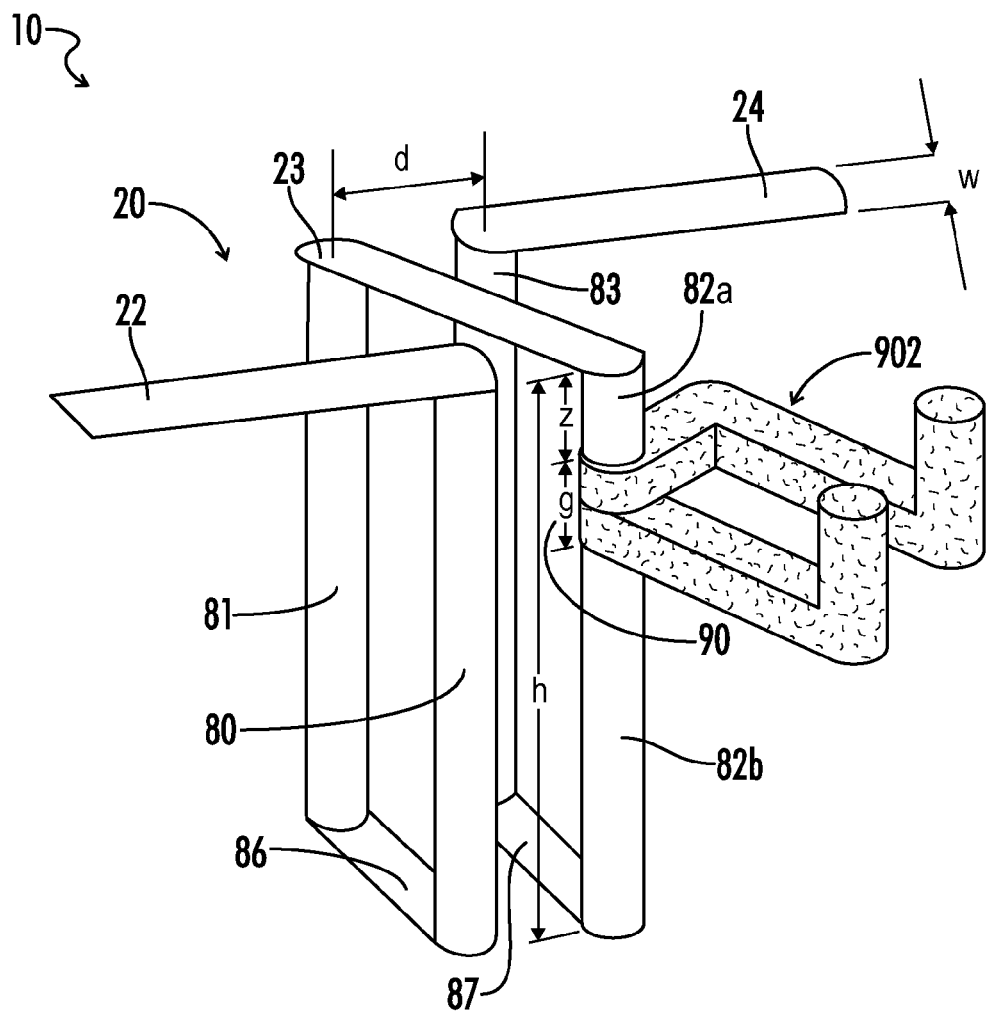
FIG. 9 is a perspective view of the example resonator of FIG. 8.

FIG. 9 depicts a perspective view of the exemplary resonator 10 of FIG. 8. The resonator 10 comprises the solenoid 20 embedded in the PCB 14 (FIG. 7). The capacitor embedded solenoid 20 comprises the top surface conductors 22-24 positioned on the top surface of the PCB 14, a plurality of vias 80-83 extending through the PCB 14, and a plurality of conductors 86 and 87, referred to hereafter for clarity as "bottom surface conductors," positioned on the bottom surface of the PCB 14. Note that, in other embodiments, it is unnecessary for the conductors 86 and 87 to be positioned on a bottom surface of the PCB 14 or other substrate. In one embodiment, the top surface conductors 22-24, the vias 80-83, and the bottom surface conductors 86 and 87 comprise copper or gold, although other conductive materials are possible in other embodiments. The via 80 extends vertically from an end of the top surface conductor 22 through the PCB 14 to an end of the bottom surface conductor 86. The via 81 extends vertically from another end of the bottom surface conductor 86 through the PCB 14 to an end of the top surface conductor 23. Furthermore, the via 83 extends vertically from an end of the bottom surface conductor 87 to an end of the top surface conductor 24.

The via 82a extends downwardly into the PCB 14 from an end of the top surface conductor 23, and the via 82b extends vertically from an end of the bottom surface conductor 87. The vias 82a and 82b are vertically aligned with one another and are separated by a capacitive gap 90. Ideally, the centerlines of the vias 82a and 82b are precisely aligned but such precise alignment is unnecessary. The vias 82a and 82b are preferably sufficiently aligned to enable the gap 90 to provide a desired capacitance for increasing the Q-factor. In this regard, the gap capacitance provided by the gap 90 effectively divides the capacitor embedded solenoid 20 into two circuits thereby dividing the inductance, resistance, and stray capacitance of the resonator 10. Accordingly, the resonance frequency is increased, which results in a relatively high Q-factor. In several embodiments, described herein, the gap 90 comprises dielectric material, such as, for example, nematic liquid crystals. In this regard, a liquid crystal dielectric 902 (within a sealed tube) fills the gap 90 for the purposes and in the manner previously described above. However, other substances such as, for example, air or plastic, may be used for the gap 90 in other embodiments.

In one embodiment, each via 80-83 is cylindrical with a radius (r) of about 125 micrometers (μm). For a GHz frequency system, the diameter of the vias 80-83 is preferably selected to be about 200 μm or less. To support mechanical and laser machining of the PCB 14, the diameter of the vias 80-83 is preferably selected to be about 75 μm or greater. Accordingly, a desired diameter of the vias 80-83 may be in the range of about 75 to 200 μm for some applications. The height (h) of the vias 80, 81, and 83 is approximately equal to the thickness of the PCB 14, which is about 3.02 millimeters (mm). Also, the width (w) of the top surface conductors 22-24 and the bottom surface conductors 86 and 87 is approximately 250 μm. The distance (d) between the top surface conductors 22-24 is also about 250 μm, and the thickness (b) of each top surface conductor 22-24 is about 35 μm. However, it should be emphasized that such dimensions are illustrative, and other dimensions are possible in other embodiments.

Furthermore, the gap 90 is positioned a distance (z) below the top surface conductor 23. Thus, the height of the via 82a is set forth as the distance (z). In one embodiment, the distance (z) is about 375 μm, although other distances (z) are possible in other embodiments. Also, the thickness (g) of the gap 90 (i.e., the distance from the via 82a to the via 82b) is about 500 μm in one embodiment. Other thicknesses (g) of the gap 90 are possible in other embodiments. Furthermore, the height of the via 82b is equal to about 2.15 mm, the distance (z) is about 375 μm and the thickness (g) is about 500 μm. Other heights of the via 82b are possible in other embodiments depending on the thickness of the PCB 14, the distance (z), and the thickness (g). The thickness (g) of the gap 90 and the distance (z) of the gap 90 below the conductor 23 directly affect the location of the poles 69 and 73 (FIG. 5), which affects the Q-factor. As the frequency distance between the poles 69 and 73 increases, the Q-factor increases up to a point, with a maximum Q-factor occurring when the frequency distance between the poles 69 and 73 is approximately 5 GHz. Thus, the location and the thickness (g) of the gap 90 are significant and the variable dielectric permittivity of the nematic liquid crystal 902 may be adjusted in order to tune the resonator 10. With a distance (z) of about 375 μm, a thickness (g) of about 500 μm, and a frequency of about 12.25 GHz, the resonator 10 of FIG. 9 should produce a frequency distance of 3.9 GHz between the poles 69 and 73, resulting in a Q-factor of about 306.

Figure 10:
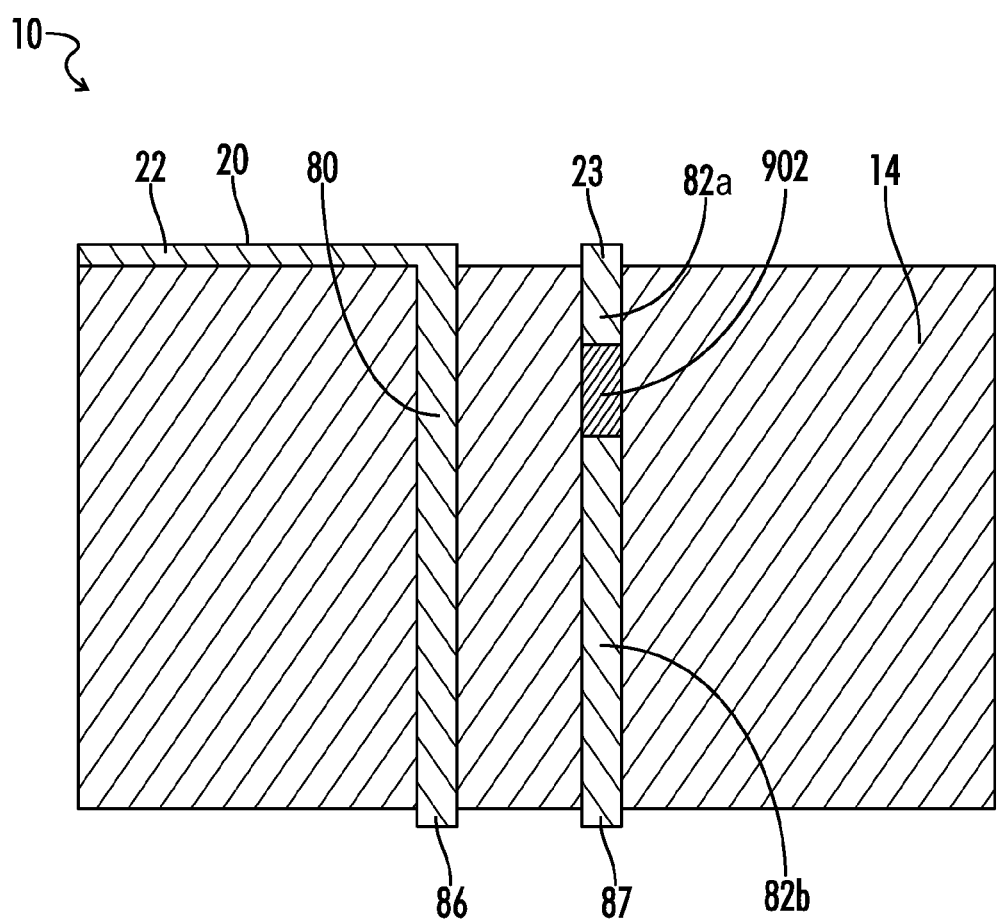
FIG. 10 is a cross-sectional view of the example resonator of FIG. 8.

FIG. 10 depicts a cross-sectional view of the resonator 10 of FIG. 2. As shown by FIG. 10, the resonator 10 comprises the solenoid 20 embedded within the PCB 14. The capacitor embedded solenoid 20 comprises the top surface conductors 22 and 23 positioned on the top surface of the PCB 14, bottom surface conductors 86 and 87 positioned on the bottom surface of the PCB 14, and vias 80, 82a and 82b extending through the PCB 14. The top surface conductor 22 is positioned horizontally on the top surface of the PCB 14. The via 80 extends perpendicularly from the top surface conductor 22, through the PCB 14, and to the bottom surface conductor 86.

Similarly, the top surface conductor 23 is positioned on the top surface of the PCB 14, and the via 82a extends perpendicularly from the top surface conductor 23 into the PCB 14. The via 82b extends perpendicularly from the bottom surface conductor 87 and into the PCB 14. The vias 82a and 82b are separated by a capacitive gap 90 (shown in FIG. 9), which is positioned within the PCB 14 (as shown in FIG. 7). In one embodiment, the capacitive gap 90 comprises dielectric material having a low relative permittivity such as, for example, a liquid crystal 902 having a relative permittivity of 2.2. In other embodiments, other substances or materials may be used in the vias 82a and 82b to create the capacitive gap 90. For example, in one embodiment, the capacitive gap 90 merely comprises air, although plastics and other material are possible. Furthermore, when fabricating the resonator 10, a via hole (not shown in FIG. 10), described in more detail hereafter, may be drilled or otherwise formed completely through the PCB 14 to enable formation of the vias 82a and 82b above and below the gap 90, which comprises material inserted into the PCB 14. However, in another embodiment, two aligned via holes (not shown in FIG. 10) may extend partially through the PCB 14 from the top and bottom surfaces of the PCB 14 such that the via 82a extends a distance (z) (FIG. 9) into the PCB 14 from the top surface, the via 82b extends partially through the PCB 14 from the bottom surface, and the vias 82a and 82b are separated by the gap 90 which comprises the PCB 14 material remaining between the via holes (not shown in FIG. 10).

The tunable liquid crystal resonator described earlier may be fabricated on fusion bonded GHz frequency dielectric PCBs that enable various creation of air voids, vias, or tubing. The above described op amps may be flip chip bonded onto microwave PCB boards with particular care given to matching the phase of the unfiltered antenna signal with that of the low frequency bias signal from the control element 150 (FIG. 1). Two separate PCB boards are microfabricated to form vias and voids for embedding the liquid crystal dielectric material within the inductor coil of the vias. The boards are joined together via fusion bonding or other bonding techniques.

The vias and/or tubes for the tunable liquid crystal resonator may be routed, drilled, punched or lasered depending on preferences, tolerances, and quality requirements. Whereas, the nematic liquid crystals may be vacuum filled within the capacitive gap. One end of the liquid crystal fill port, shown in FIG. 3, will be sealed. The entire chip may be placed in a chamber and brought down to vacuum pressure. Afterwards, as little as a single liquid crystal drop may be placed on the open liquid crystal fill port. Capillary action occurs to initially draw the liquid crystal into the port. Thereafter, the chamber is slowly brought up to atmospheric pressure in order to force the liquid crystal to fill all gaps within the structure of the tunable resonator.

Multiple applications may benefit from the low frequency bias tunable resonator including (1) the ability to tune different channels coming off of a satellite antenna prior to the signal going into a satellite transceiver. As such, a satellite user may be able to simultaneously download data, talk on a phone, play a subscription movie, and download another movie all on different channels, because a computer chip changes resonant frequencies inside an LC, thereby changing frequency of input channels for the transceiver. Conventional multiplexing may be done with a single tunable filter and the data can be modulated for a transceiver.

Second, the ability to tune different channels can also be employed in cellular communication, for example within a range of 1.5 GHz-2.6 GHz. As a result, current and future wireless communication standards such as 4G LTE, 5G, and 6G may be improved.

Third, improved imaging signals for Doppler weather radar operating in the range of 2.4 GHz-6 GHz may be significantly improved as well because of the tuning of the liquid crystal. As such it is contemplated that several other applications that operate between 1.0 GHz-12 GHz, for example, may be drastically improved as well.

Commonly-assigned pending patent application, U.S. Ser. No. 13/283,138 and filed on Oct. 27, 2011, which is incorporated herein by reference in its entirety, describes various embodiments and theory regarding the present disclosure. It should be emphasized that the embodiments described herein are by way of example, and various modifications and changes to the embodiments described herein would be apparent to a person of ordinary skill.

The invention claimed is:

1. A system, comprising
a resonator having a dielectric substrate, a liquid crystal dielectric and a plurality of conductive vias, the plurality of conductive vias extending through the dielectric substrate and forming an inductive coil embedded in the dielectric substrate, the plurality of conductive vias including at least a first conductive via and a second conductive via within a turn of the inductive coil, wherein the liquid crystal dielectric is embedded within the inductive coil between the first conductive via and the second conductive via, thereby forming a tunable capacitive component within the inductive coil in series with the first conductive via and the second conductive via; and
a control element for biasing the tunable capacitive component to vary a permittivity and capacitance of the tunable capacitive component, thereby controlling a resonance quality factor of the resonator.

2. The system of claim 1, further comprising an antenna coupled to the inductive coil, wherein the resonator is configured to filter a signal received from the antenna, and wherein the control element is configured to control a passband of the resonator via a bias signal.

3. The system of claim 2, wherein the control element biases the tunable capacitive component with the bias signal, the bias signal having a bandwidth less than a bandwidth of the signal received from the antenna.

4. The system of claim 1, wherein the control element biases the tunable capacitive component with a low frequency bias of thousands of hertz.

5. The system of claim 1, wherein the plurality of conductive vias include at least a third conductive via, and wherein the inductive coil has a conductor that conductively couples the first conductive via to the third conductive via.

6. The system of claim 1, wherein the liquid crystal dielectric is a nematic liquid crystal.

7. The system of claim 1, wherein the dielectric substrate has a first surface and a second surface that is opposite to the first surface, wherein the first conductive via extends from a first conductor on the first surface and the second conductive via extends from a second conductor on the second surface.

8. The system of claim 7, wherein the first conductive via is between the liquid crystal dielectric and the first conductor.

9. The system of claim 8, wherein the second conductive via is between the liquid crystal dielectric and the second conductor.

10. A method, comprising:
providing a resonator having a dielectric substrate, a liquid crystal dielectric and a plurality of conductive vias, the plurality of conductive vias extending through the dielectric substrate and forming an inductive coil embedded in the dielectric substrate, the plurality of conductive vias including at least a first conductive via and a second conductive via within a turn of the inductive coil, wherein the liquid crystal dielectric is embedded within the inductive coil between the first conductive via and the second conductive via, thereby forming a tunable capacitive component within the inductive coil in series with the first conductive via and the second conductive via; and
controlling a resonance quality factor of the resonator, the controlling comprising biasing the tunable capacitive component with a bias signal, thereby varying a permittivity and capacitance of the tunable capacitive component.

11. A method for forming a tunable resonator, comprising the steps of:
forming an inductive coil embedded in a dielectric substrate, the inductive coil having a void space between a first conductive via of the inductive coil and a second conductive via of the inductive coil;
filling the void space of the inductive coil with a liquid crystal dielectric to embed a capacitive component within the inductive coil in series with the first conductive via and the second conductive via; and
providing a bias signal to the capacitive component to vary a permittivity of the liquid crystal dielectric thereby tuning the tunable resonator.

12. The method of claim 11, wherein the filling step comprises a step of vacuum filling the void space with the liquid crystal dielectric.

13. The method of claim 11, wherein the liquid crystal dielectric is a nematic liquid crystal.

14. The method of claim 11, wherein the inductive coil is sectioned by a channel for holding the liquid crystal dielectric in place.

15. The method of claim 11, wherein the inductive coil comprises a plurality of conductive vias extending through the dielectric substrate the plurality of conductive vias including the first conductive via, the second conductive via, and a third conductive via, and wherein the liquid crystal dielectric is disposed between the first conductive via and second conductive via to form the capacitive component within the inductive coil.

16. A system, comprising:
  a resonator having a dielectric substrate and an inductive coil having at least one turn, the inductive coil comprising at least one conductor and a plurality of conductive vias, the plurality of conductive vias extending through the substrate and including at least a first conductive via, a second conductive via, and a third conductive via, wherein a liquid crystal dielectric is disposed between the first conductive via and the second conductive via and forms a capacitive element within the inductive coil in series with the first conductive via and the second conductive via; and
  a control element configured to transmit a bias signal to the inductive coil for biasing a capacitance of the capacitive element.

17. The system of claim 16, wherein the at least one conductor is formed on a surface of the dielectric substrate and conductively couples the first conductive via to the third conductive via.

18. The system of claim 16, further comprising an antenna coupled to the inductive coil, wherein the resonator is configured to filter a signal received from the antenna, and wherein the control element is configured to control a passband of the resonator via the bias signal.

19. The system of claim 16, wherein the liquid crystal dielectric is a nematic liquid crystal.

20. The system of claim 16, wherein the dielectric substrate has a first surface and a second surface that is opposite to the first surface, and wherein the first conductive via extends from a first conductor on the first surface and the second conductive via extends from a second conductor the second surface.

21. The system of claim 20, wherein the first conductive via is between the liquid crystal dielectric and the first conductor.

22. The system of claim 21, wherein the second conductive via is between the liquid crystal dielectric and the second conductor.

* * * * *